(12) United States Patent
Cohen et al.

(10) Patent No.: US 7,489,123 B2
(45) Date of Patent: Feb. 10, 2009

(54) CALIBRATION CONTROL FOR PIN ELECTRONICS OF AUTOMATIC TESTING EQUIPMENT

(75) Inventors: Stephen A. Cohen, Andover, MA (US); Thomas G. O'Dwyer, Clonlara (IE)

(73) Assignee: Analog Devices, Inc., Norwood, MA (US)

( * ) Notice: Subject to any disclaimer, the term of this patent is extended or adjusted under 35 U.S.C. 154(b) by 280 days.

(21) Appl. No.: 11/296,858

(22) Filed: Dec. 7, 2005

(65) Prior Publication Data

US 2006/0195749 A1    Aug. 31, 2006

Related U.S. Application Data

(60) Provisional application No. 60/633,881, filed on Dec. 7, 2004.

(51) Int. Cl.
*G01R 31/28* (2006.01)

(52) U.S. Cl. .................................. 324/158.1

(58) Field of Classification Search ........................ None
See application file for complete search history.

(56) References Cited

U.S. PATENT DOCUMENTS 4,517,512 A * 5/1985 Petrich et al. ............... 714/724
5,200,696 A * 4/1993 Menis et al. ............. 324/158.1
5,428,297 A * 6/1995 Grace et al. .................. 324/758

OTHER PUBLICATIONS

Gasbarro, et al. "Integrated Pin Electronics for VLSI Functional Testers," *IEEE Journal of Solid-State Circuits*, vol. 24, No. 2, Apr. 1989, pp. 331-337.

* cited by examiner

*Primary Examiner*—Paresh Patel
(74) *Attorney, Agent, or Firm*—Bromberg & Sunstein LLP

(57) ABSTRACT

An integrated circuit for automatic calibration control of pin electronics is disclosed. The integrated circuit includes a substrate, and both pin electronics and a calibration circuit integral with the substrate. The calibration circuit is dedicated to a single channel of automatic testing equipment for a single pin of a device under test. Each sub-circuit of the pin electronics may include a replica output. The replica output is electrically coupled to the calibration circuit. The calibration circuit may include a multiplexor for receiving each of the replica outputs from the sub-circuits, such as a comparator, load and a driver, and for selectively switching between the replica outputs to determine calibration parameters for one or more levels of the sub-circuit. The calibration circuit includes a state machine capable of determining calibration parameters including offset and gain. After determining the calibration parameters, the state machine can compensate the one or more levels for each sub-circuit of the pin electronics based upon the calibration parameters.

16 Claims, 11 Drawing Sheets

Driver With Replica Output

- The Replica output has the same DC characteristics as the main output but much lower current capability
- The Replica output goes to the Calibration mux.

FIG. 8

| FIG. 8A |
|---------|
| FIG. 8B |
| FIG. 8C |

FIG. 8A

```
calibration
note /* and */ bracket comments

Disable External Control inputs for Driver, Comparator, Load, Etc
Driver Calibration
    Internal measure mux select Driver Replica output /*could also select main
through mux*/
    Set Driver to VHI
    Set VHI level to zero volts
    Measure Driver output voltage
    Store Driver VHI offset
    Set VHI to 5V /*select voltage as convenient*/
    Measure Driver output voltage
    Compute slope error
    Store VHI slope error
    Test Offset error is within spec
    If fail then set fail flag
    Test slope error is within spec
    If fail then set fail flag
    /Repeat Steps above for other Driver levels; VLO, Vterm
    /stored errors will be used to correct customer inputted levels
```

```
Comparator Calibration
    /*Internal measure mux select Comparator Replica input*/
    /*Internal measure mux select Comparator Replica output*/
    Force Zero Volts on Comparator Replica input
    Adjust Comparator CVH threshold until switch point is determined
    Store offset voltage
    Force 5V on Comparator Replica input /*select voltage as convenient*/
    Adjust Comparator Vhi threshold until switch point is determined
    Compute slope error
    Store slope error
    Test offset error is within spec
    If fail then set fail flag
    Test slope error is within spec
    If fail then set fail flag
    /*Repeat Steps above for other Comparator levels; CVL*/
    /*Stored errors will be used to correct Customer inputed levels*/
    /* Procedure may be extended to calibrate Differential Comparator inputs as
well as */
    /*Common Mode Inputs*/

Load Calibration
    /*Internal measure mux select Load Replica output, measure mode = current*/
    Set Vcom to 2V /*select voltage as convenient*/
    Set Iol to 1mA /*select current as convenient*/
    Measure Load output current
    Set Iol to 10mA /*select current as convenient*/
    Measure Load output current
    Compute offset and slope errors
    Test Offset error is within spec
    If fail then set fail flag
    Test slope error is within spec
```

FIG. 8B

```
          If fail then set fail flag/*stored errors will be used to correct Customer
inputed levels*/
          Set Vcom to -2v /*select voltage as convenient*/
          Set Ioh to 1mA /*select current as convenient*/
          Measure Load output current
          Set Ioh to 10mA /*select current as convenient*/
          Measure Load output current
          Compute offset and slope errors
          Test Offset error is within spec
                                      flowchart
          If fail then set fail flag
          Test slope error is within spec
          If fail then set fail flag/*Stored errors will be used to correct Customer
inputed levels*/
          Set measure mode = voltage
          Set Ioh to 1mA
          Set Iol to 1mA
          Set Vcom to Zero Volts
          Measure Load output voltage
          Store Load Vcom offset voltage
          Set Vcom to 5volts /*select voltage as convenient*/
          Measure Load output voltage
          Compute slope error
          /*Stored errors will be used to correct Customer inputed levels*/
          /* Procedure may be extended to calibrate Differential Comparator inputs as
well as */
          Test Offset error is within spec
          If fail then set fail flag
          Test slope error is within spec
          If fail then set fail flag
```

FIG. 8C

CALIBRATION CONTROL FOR PIN ELECTRONICS OF AUTOMATIC TESTING EQUIPMENT

CROSS REFERENCE TO RELATED APPLICATIONS

The present application claims priority from U.S. provisional patent application No. 60/633,881 filed Dec. 7, 2004 entitled "Self Calibrating Levels," which is incorporated herein by reference in its entirety.

TECHNICAL FIELD AND BACKGROUND ART

The present invention relates to automatic testing equipment for testing integrated circuits and more specifically to self calibration of pin electronics.

The testing of integrated circuits presently involves the use of automatic test equipment (ATE) 100. The ATE includes a central control unit 110 that oversees the ATE as well as a plurality of channel cards 120. Each channel card 120 can be associated with a plurality of channels. Each pin of an integrated circuit device, known in the art as the "device under test" or DUT, is coupled to one of the channels of the ATE. A channel in the ATE is defined by the electronics that are associated with a single pin of the DUT. In general, a pin of the DUT is electrically coupled to pin electronics 130. Pin electronics 130 include, but is not limited to one or more of the following, a comparator, a load, a driver, an analog-to-digital converter (ADC), a digital-to-analog converter (DAC) and a parametric measurement unit (PMU). Each channel card 120 includes a levels generator 140. A levels generator 140 generates analog reference levels for use by the pin electronics 130. The levels generator 140 includes a plurality of DACs that each generates a reference level. Multiple references levels may be generated for each sub-circuit of the pin electronics including the comparator, driver, load or other parts of the pin electronics.

The pin electronics 130 need to be calibrated in order to meet the specifications of the tester manufacturer, so that the ATE will work for its intended purpose. For example, the pin electronics 130 can experience voltage, offset, first order nonlinearity (gain) and second order non-linearities. If the pin electronics are not properly calibrated, the ATE 100 will not be capable of accurately testing the integrated circuit devices.

In general, in order to calibrate the pin electronics 130 for each channel, the pin electronics 130 are coupled to a central or quasi-central resource 110 of the automatic testing equipment's analog sub-system which performs calibration one pin at a time. As shown in FIG. 1, the central system calibration resource 110 provides the calibration signals and measures the result of the calibration signal for each individual pin electronics channel. All of the calibration resources are provided in this central location. The centrally located calibration resources are coupled to each pin through a matrix line. The test system's main processor controls calibration relays 150 in order to select the pin electronics to calibrate.

Because of sensitivities to conditions, such as temperature, the pin electronics need to be recalibrated on a regular basis. If a large temperature change occurs during testing, the pin electronics need to be recalibrated. As a result, the DUTs would need to be disconnected during recalibration, since the recalibration process requires use of the output pin. Because the prior art calibration systems for ATE have used at best quasi-central resources, require disconnecting the DUTs and the DUT interface board, and can include thousands of pin electronics circuits, the recalibration times can be greater than an hour for a single ATE.

SUMMARY OF THE INVENTION

Apparatus and methods for automatic calibration control of pin electronics within automatic test equipment (ATE) are disclosed. In one embodiment, each channel of the ATE for a separate pin of a device under test includes a dedicated calibration circuit and pin electronics. The pin electronics and calibration circuit may be integral with a substrate forming an integrated circuit. In certain embodiments, each sub-circuit of the pin electronics includes a replica output. The replica output is electrically coupled to the calibration circuit. By providing a replica output, the device under test does not need to be disconnected from the automatic test equipment during calibration. The calibration circuit may include a multiplexor for receiving each of the replica outputs from the sub-circuits, such as a comparator, load and a driver, and for selectively switching between the replica outputs to determine calibration parameters for one or more levels of the sub-circuit. In addition to the pin electronics and the calibration circuit, each channel may include a levels generator. The levels generator may also be part of an integrated circuit and integral with the substrate that includes the calibration circuit and the pin electronics. The levels generator includes a plurality of digital to analog converters that are each electrically coupled to the pin electronics and are capable of setting a level within a sub-circuit of the pin electronics. During the calibration process, the calibration circuit, which includes a state machine, takes control of the pin electronics and the levels generator. The state machine sends digital signals to one or more of the digital to analog converters within the levels generator for controlling the levels of the sub-circuits of the pin electronics. The calibration circuit measures the output that results from the levels being set and determines calibration parameters including offset and gain. The offset and gain can be either voltage or current depending upon the sub-circuit of the pin electronics being calibrated. After determining the calibration parameters, the state machine can compensate the one or more levels for each sub-circuit of the pin electronics based upon the calibration parameters.

In certain embodiments, the pin electronics include replica inputs that can be used during calibration. During calibration, the state machine of the calibration circuit can disable the inputs of the sub-circuits of the pin electronics.

In certain embodiments, the pin electronics may include a comparator, a load, a driver, and a PMU having replica outputs.

BRIEF DESCRIPTION OF THE DRAWINGS

The foregoing features of the invention will be more readily understood by reference to the following detailed description, taken with reference to the accompanying drawings, in which:

FIG. 8 shows pseudo code for controlling the calibration process.

DETAILED DESCRIPTION OF SPECIFIC EMBODIMENTS

Figure 2:
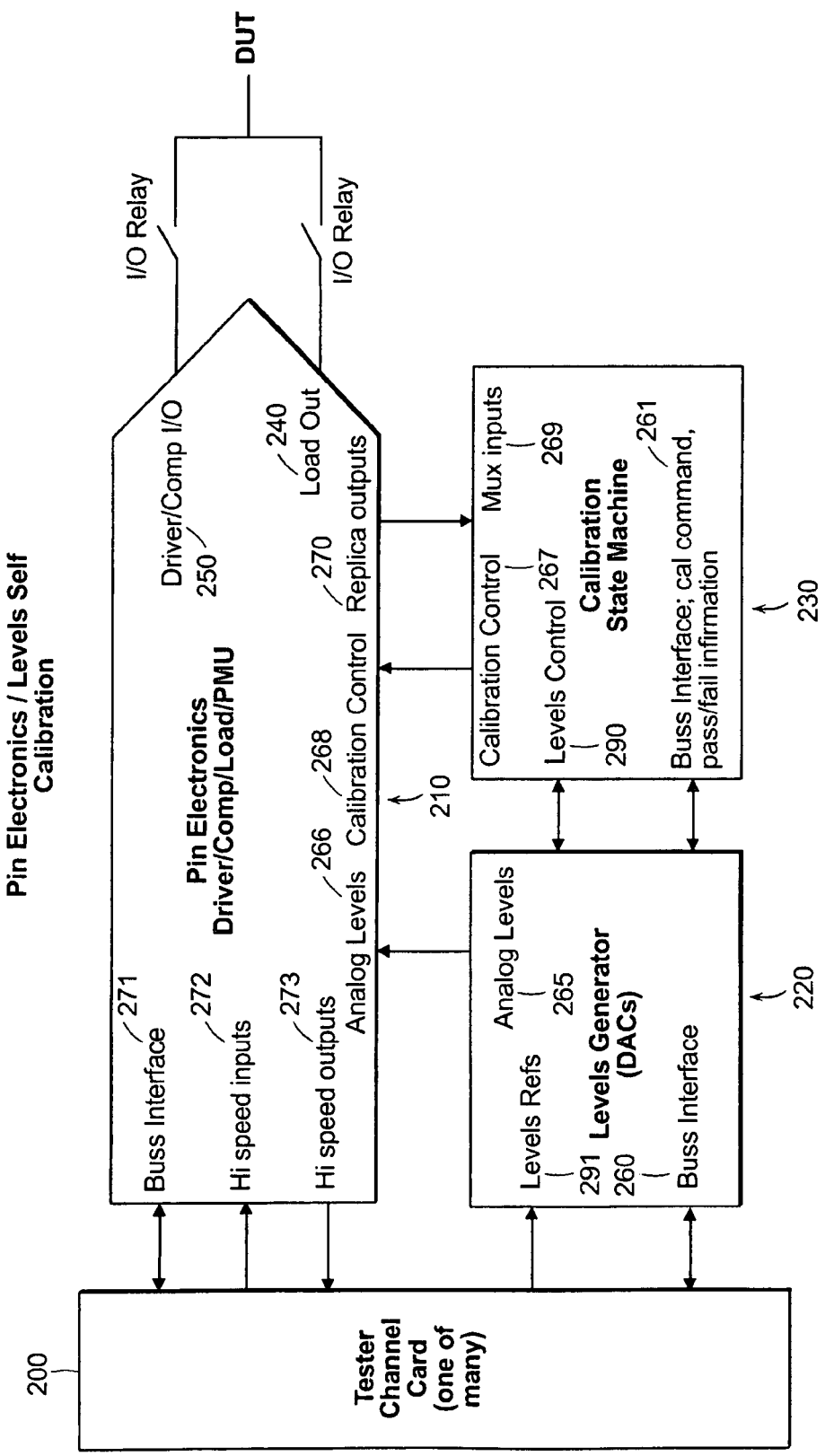
FIG. 2 is an embodiment of a circuit within Automatic Testing Equipment environment for use with a single pin of a device under test.

FIG. 2 shows a pin electronics tester board, known to those of ordinary skill in the art as a channel card 200. As shown, the channel card 200 has attached a pin electronics circuit 210, a levels generator circuit 220 and a calibration circuit 230 including a calibration state machine. In practice, for each channel there will be a separate pin electronics circuit 210, levels generator circuit 220 and a calibration circuit 230 and each channel card can include a plurality of channels. The pin electronics circuit 210, the levels generator circuit 220 and the calibration circuit 230 may be formed on a common substrate, such as silicon or gallium arsenide, defining an integrated circuit. In other embodiments, the circuits may be grouped on two separate substrates, or the three circuits may each be connected to a separate substrate.

By providing a separate calibration circuit for each channel, calibration of the pin electronics for the entire ATE can occur in parallel.

The pin electronics circuit 210 includes an interface to the DUT. As shown in this embodiment, the interface includes a driver and comparator input/output (I/O) pin 250 and a load output pin 240. The pin electronics also include replica input/output pins 270. Each replica input/output is a secondary input/output signal that produces a replica of the primary input/output signal that is either sent to or received from the DUT through the I/O 250 and output 240 interface. By providing a replica input/output to the calibration circuit, the DUT does not need to be removed from the pin electronics during calibration. Therefore, if a temperature change occurs during processing, a calibration mode can be enabled, the pin electronics can be calibrated, and testing can immediately resume.

The pin electronics (PE) circuit 210 includes a number of inputs and outputs. The PE circuit is electrically coupled to the tester board by a plurality of connections including: one or more signal inputs 272, one or more signal outputs 273, and a bus interface 271. The bus interface 271 transmits control signals to the pin electronics in order to select between different states. For example, the control signal may allow for selection of differential mode comparator operation or window comparator operation. The inputs 272 and the outputs 273 provide access to data either being transmitted to the DUT or read from the DUT. For example, if the device under test is a memory chip, the inputs 272 would provide the data words to be read into the memory and the outputs 273 would allow the data read from the memory to be compared by the main control unit. Additionally, the pin electronics 210 have an input for receiving the analog level signals 266 for programming the analog levels for the pin electronics. The pin electronics also include calibration control inputs 268 and associated circuitry. The calibration control 230 provides a calibration control signal to the pin electronics for setting the pin electronics into a calibration mode.

The pin electronics 210 may internally include such sub-circuits as a load, a comparator, a driver, a load, reflection clamps and parametric measurement units. The pin electronics 210 should not be considered as being limited to any particular circuits or groups of circuits.

Electrically coupled to the pin electronics 210 circuit is a levels generator circuit 220 and a calibration circuit 230. The levels generator 220 generates one or more analog levels that are used by the pin electronics. For example, the levels generator 220 can receive level information from a main control unit (not shown) for each of the pin electronics sub-circuits (driver, comparator, etc.) including an absolute low voltage level and an absolute high voltage level (e.g. 0 and 5V) 291. The bus interface input 260 receives in the address of the DAC associated with a level and also the level for setting the DAC. During normal operation the main control unit sends this information through the bus interface. For example, the bus interface 260 may receive in a signal indicating that DAC no. 1 is to provide voltage levels Vhigh=5.0V to the driver. During normal operation of the ATE, the levels generator 220 operates in conjunction with the pin electronics 210 to perform the desired tests for a pin of a device under test.

If calibration is required, the main control unit issues a signal over the system bus to initiate calibration (e.g. cal command) 261. The calibration state machine 230 takes control of the levels generator 220 and the pin electronics 210 from the main control unit. The calibration state machine 230 issues a calibration signal to the pin electronic 210 through the calibration control output 267. This signal causes the external control inputs for the driver, comparator, load or any other circuit of the pin electronics to be disabled. The calibration state machine 230 then sends a signal to the levels generator 220. The signal that is received by the levels generator 220 from the calibration state machine 230 causes the selection of a digital-to-analog converter within the levels generator 220 that is electrically coupled to the sub-circuit in the pin electronics to be calibrated. For example, if the calibration state machine 230 is calibrating the driver, calibration state machine 230 selects the DAC of the levels generator electrically coupled to the driver through the levels control 290 and causes the DAC of the levels generator circuit 220 to provide a plurality of levels to one of the driver inputs (e.g. Vhigh). The calibration state machine 230 may indicate that 0 Volts is to be forced at the driver input Vhigh. This signal representative of the voltage to be provided to the driver is passed to the levels generator 220 which converts the digital signal to an analog signal and provides the signal to the driver. The driver produces an output and the output is sampled and passed to calibration state machine 230 through the replica outputs 270 of the driver pin electronics into the multiplexor inputs 269 of the calibration state machine 230. The calibration state machine 230 issues a control signal to the multiplexor 269 indicating that the multiplexor 269 should pass the driver output. The calibration state machine 230 collects the output signal from the driver. The output signal is compared to an expected output signal and the difference is determined which is DC offset value. The calibration state machine 230 will cause the levels generator 220 to produce a second test signal to the driver for Vhigh (e.g. 5 volts). The replica output of the driver is read by the calibration state machine 230. The calibration state machine 230 can then determine based upon the at least two measurements a gain for the driver circuit. Based upon this gain value and the DC offset, calibration parameters are determined. The calibration parameters can be used to alter the output of the pin electronics, so that the pin electronics meet the specifications required by the tester manufacturer in order to have a functioning ATE. For example, the calibration state machine 230 may include registers for storing the offset and gain. These values may be read by the main control unit which can then perform calculations and alter the desired voltage levels that are to be used to test the DUT in order to compensate for the voltage offset and gain. In another embodiment, the voltage offset and gain can be programmed into the DAC of the levels generator so that the output signal from the DAC directly provides the compensated levels. In a third embodiment, a separate DAC may be included after the levels generator DAC. This DAC is explicitly included for the purpose of changing the output of the levels generator to compensate for the voltage offset and the gain during testing. In yet another embodiment, the calibration state machine 230 can pre-compensate the digital voltage/current level signal that is passed to the levels generator 220.

The bus interface 261 also receives signals from the calibration circuitry including an indication if the calibration is complete or if the calibration has failed. This information is provided to the main control unit.

Figure 1:
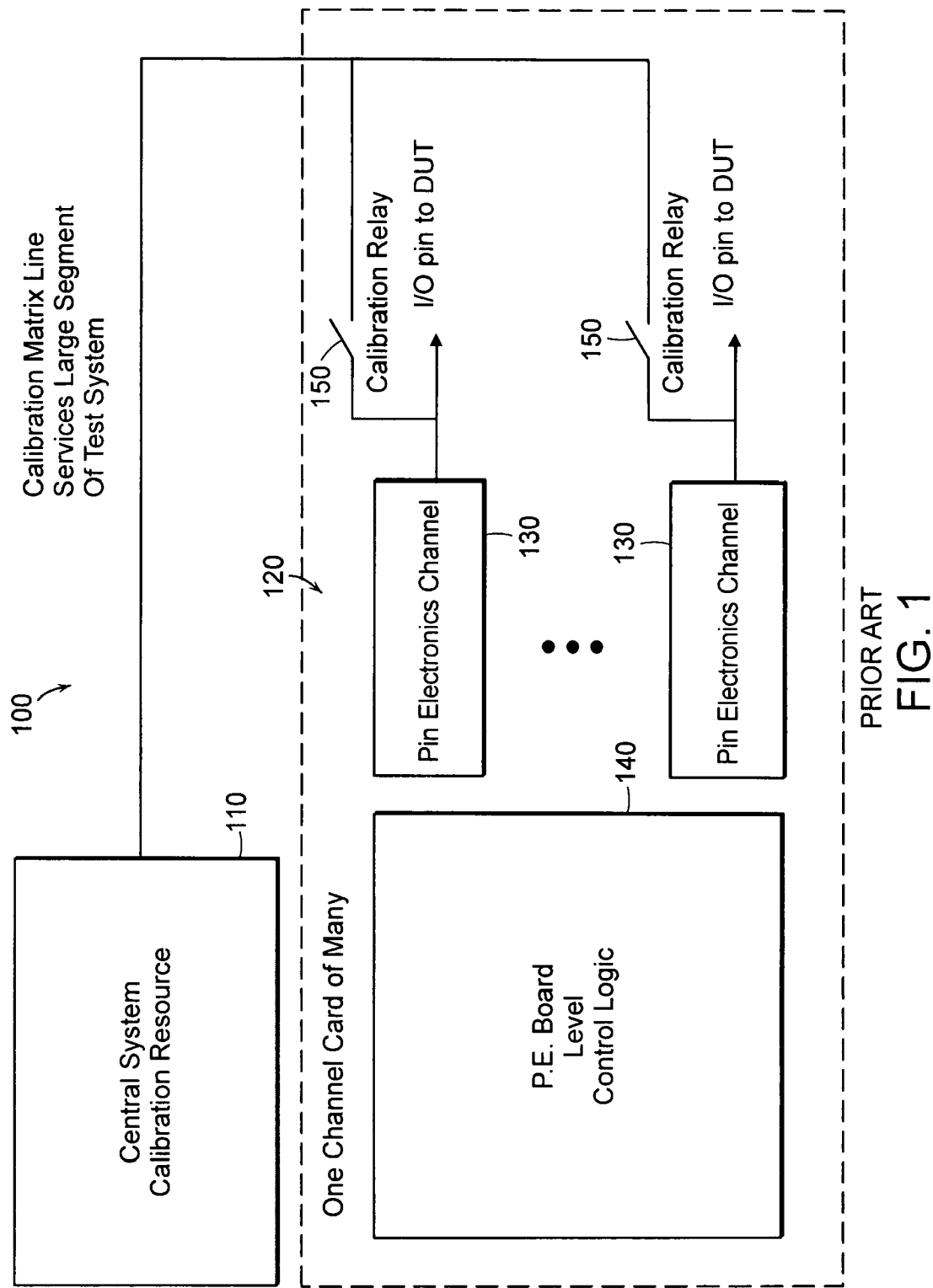
FIG. 1 is a prior art embodiment of an ATE system with a centralized calibration system.
Figure 3:
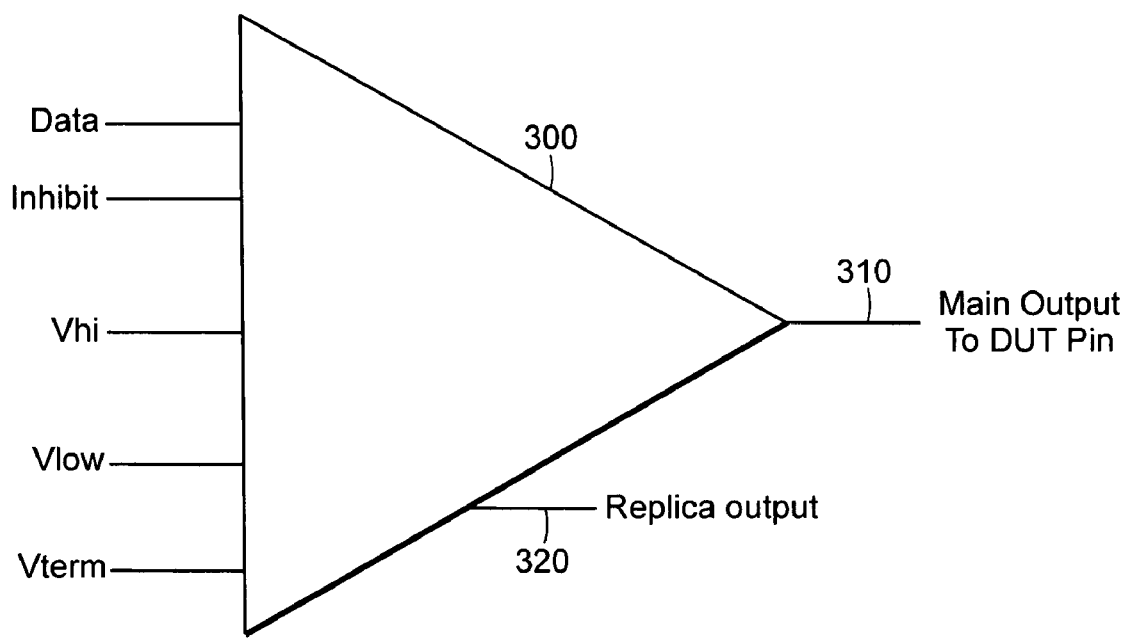
FIG. 3. shows an exemplary driver circuit that could be part of the pin electronics of FIG. 2.

FIG. 3. shows an exemplary driver circuit 300 that could be used in the pin electronics of FIG. 1. The driver includes standard driver inputs including: a data input, an inhibit input, and a plurality of voltage levels, Vhigh, Vlow, and Vterm. The driver circuit deviates from the standard driver in pin electronics by providing both a regular output 310 for connection to the DUT, Drout, and a replica output 320 that is switched to the calibration circuitry when required. The replica output has the same DC characteristics as the regular output, but is not connected to the DUT and only transfers a replica output signal to the calibration multiplexor. Since the replica output is only used for calibration, a CMOS multiplexor (see 269 in FIG. 2) built in to the calibration circuitry are used rather than relays.

Figure 4:
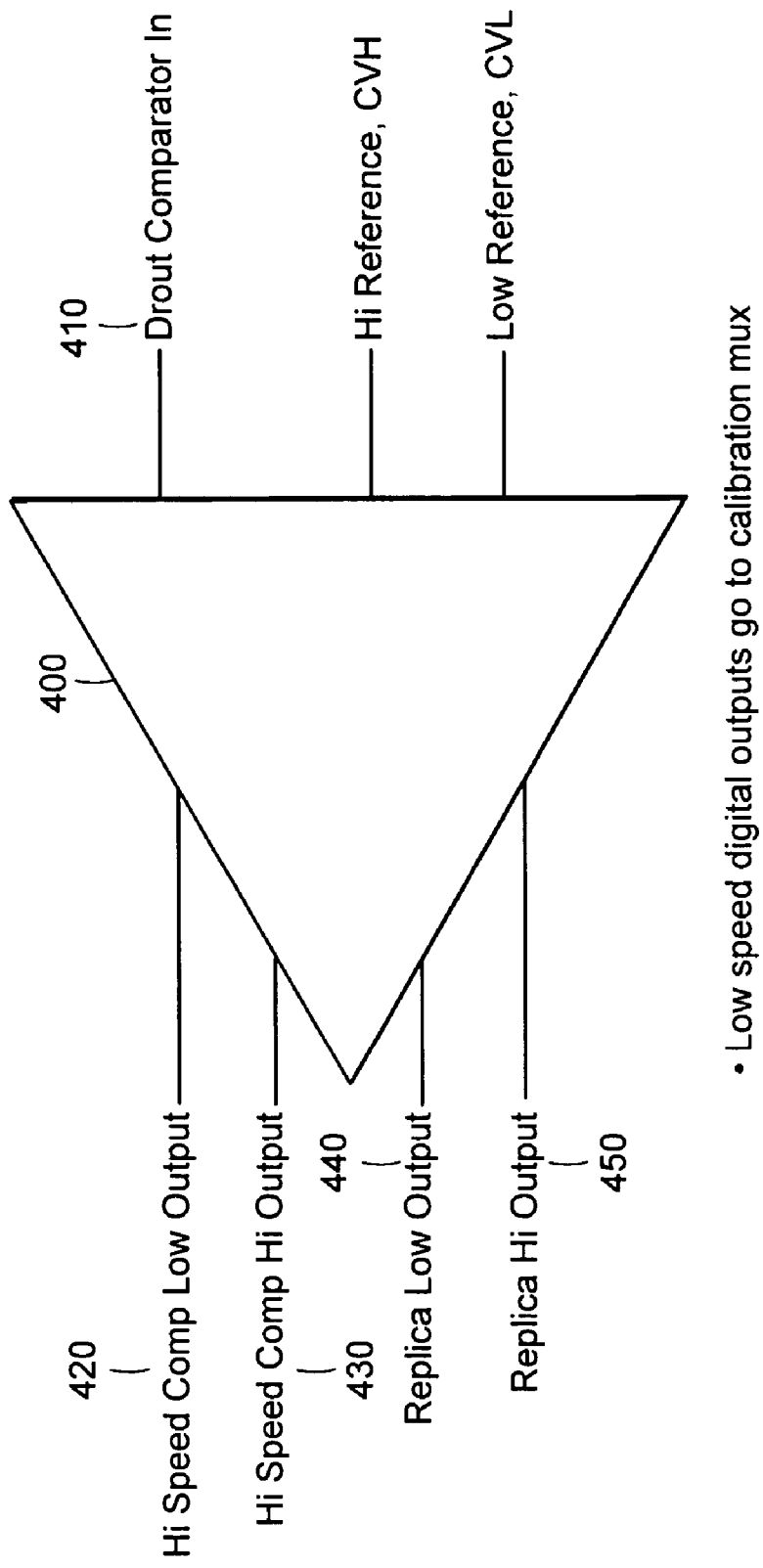
FIG. 4 shows an exemplary comparator that could be part of the pin electronics of FIG. 2.

FIG. 4 shows an exemplary comparator 400 that could be part of the pin electronics of FIG. 1. The comparator 400 includes a plurality of inputs and outputs. The inputs include a signal input, DRout 410, from the DUT, a high reference input CVH and a low reference input CVL. The outputs include a low comparison output 420, wherein the DUT input is compared to the low reference input, a high comparison output 430, wherein the DUT input is compared to the high reference input, and replica outputs of both the low 440 and high 450 comparison outputs. In embodiments in which the comparator input is connected to the driver output, a replica of the comparator input would be constructed having the DC front end characteristics of the comparator. This input would be connected to the calibration I/O of the level generator as shown in FIG. 1. In other embodiments where the comparator input is connected to the driver output, the input to the comparator would be driven by the driver circuit, after the driver circuit was calibrated.

Figure 5:
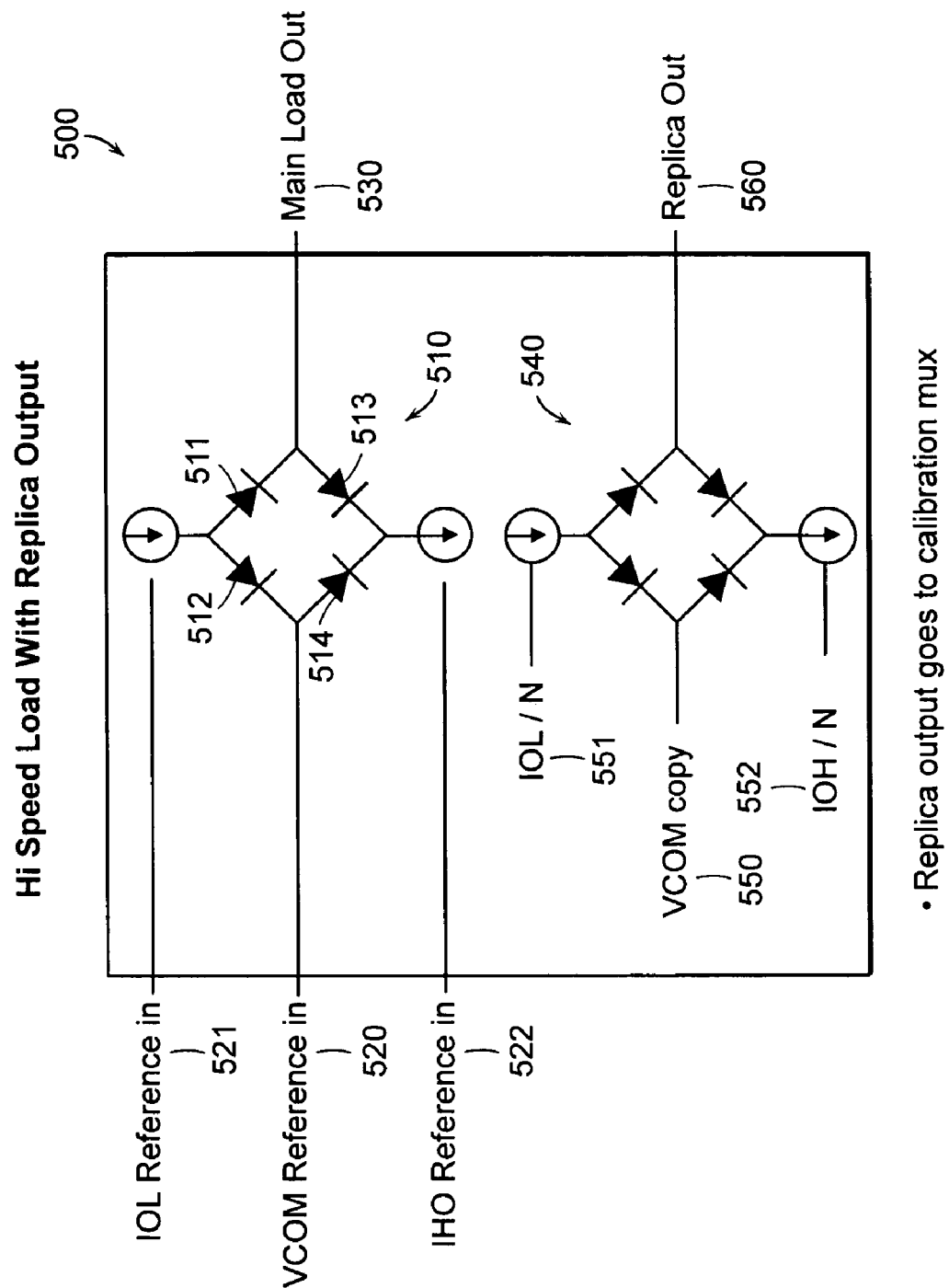
FIG. 5 shows an exemplary load that could be part of the pin electronics of FIG. 2.

FIG. 5 shows an exemplary load 500 that could be part of the pin electronics of FIG. 1. The load is constructed from a diode bridge 510 with a programmable low reference current supply IOL 521 attached between two of the diodes 511, 512 and a programmable high reference current supply IOH 522 attached between the other two diodes 513, 514 of the diode bridge 510. A commutation voltage 520 is presented at one input and the output from the DUT 530 is provided as a second input. Depending on the differential between the commutation voltage and the DUT voltage, current is either sourced to or sunk from the DUT. The load circuitry for producing a replica output includes a replica of the diode bridge 540 and includes copies of IOH and IOL programmable current sources 552, 551. The copies may be fractional copies of the program currents and can be used in combination with a known resistor for calibration. Additionally a copy of the commutation voltage Vcom 550 is provided. The replica output 560 is connected to the calibration multiplexer.

Figure 6:
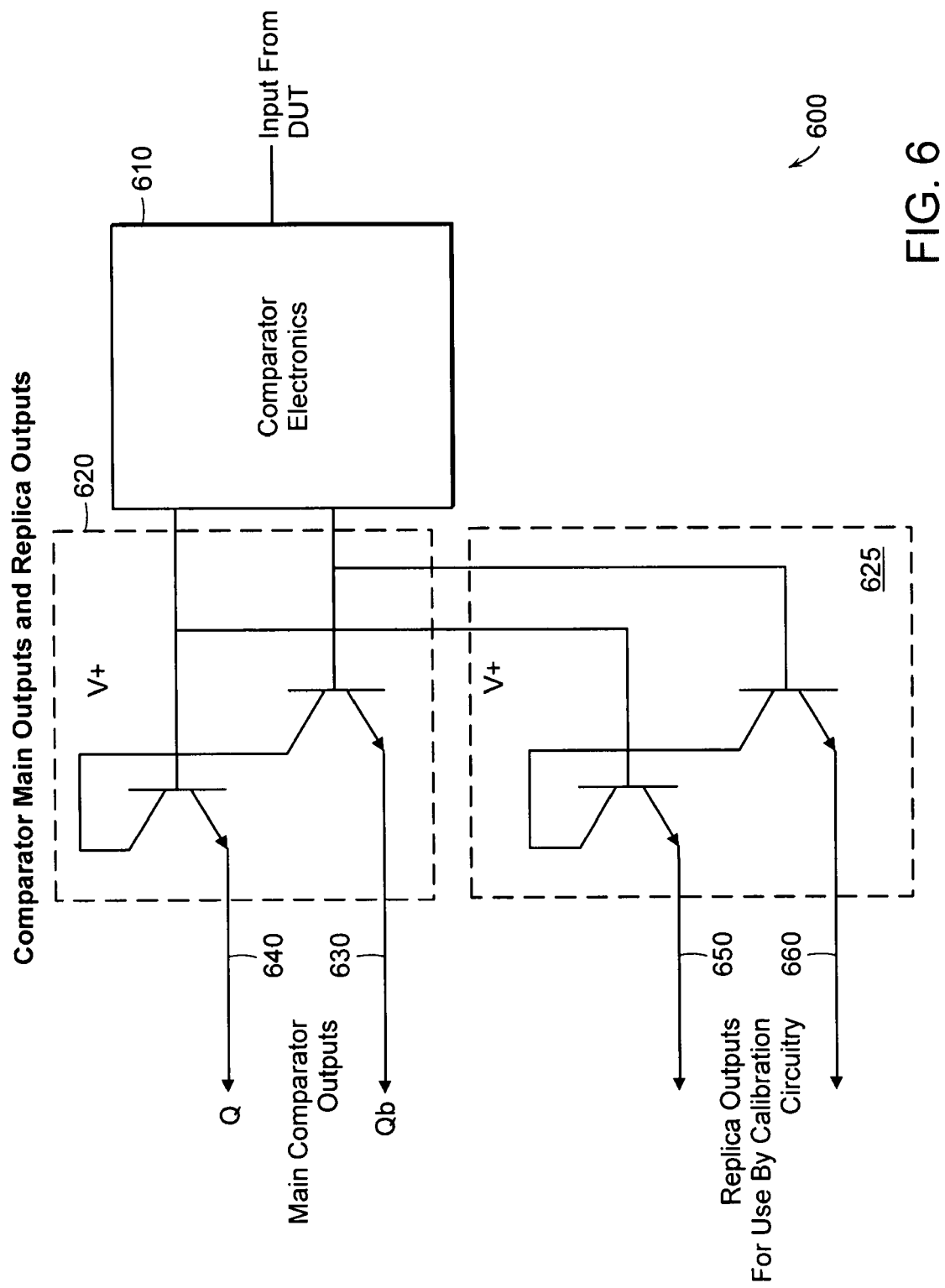
FIG. 6 is a schematic showing how the replica outputs for the comparator are produced.

FIG. 6 is a schematic showing how the replica outputs 650, 660 for the comparator are produced wherein the schematic includes the comparator electronics 610 and an output stage 620. The comparator electronics 610 perform the comparator functionality and can take on a number of different forms. For example, the comparator can be a window or a differential comparator. Thus, the comparator electronics box 610 represents any one of the known comparator structures. In this embodiment, an emitter follower is used as the output stage 620; however other types of output stages may also be used. The comparator produces two output signals, an output Q 640 and its complement Qb 630. The emitter follower 620 is formed for each output by a bi-polar transistor that receives into the base of the transistor the output signal from the comparator electronics. The output is then read at the emitter of each transistor. In order to produce the replica outputs the output signal is sampled between the comparator electronics 610 and the output stage 620 and a replica emitter follower 625 is provided for both the output and its complement. The bi-polar transistors of the replica output emitter follower can be sized smaller than the normal output transistors in order to provide a smaller load and to reduce the amount of silicon area needed to fabricate the circuit.

Figure 6A:
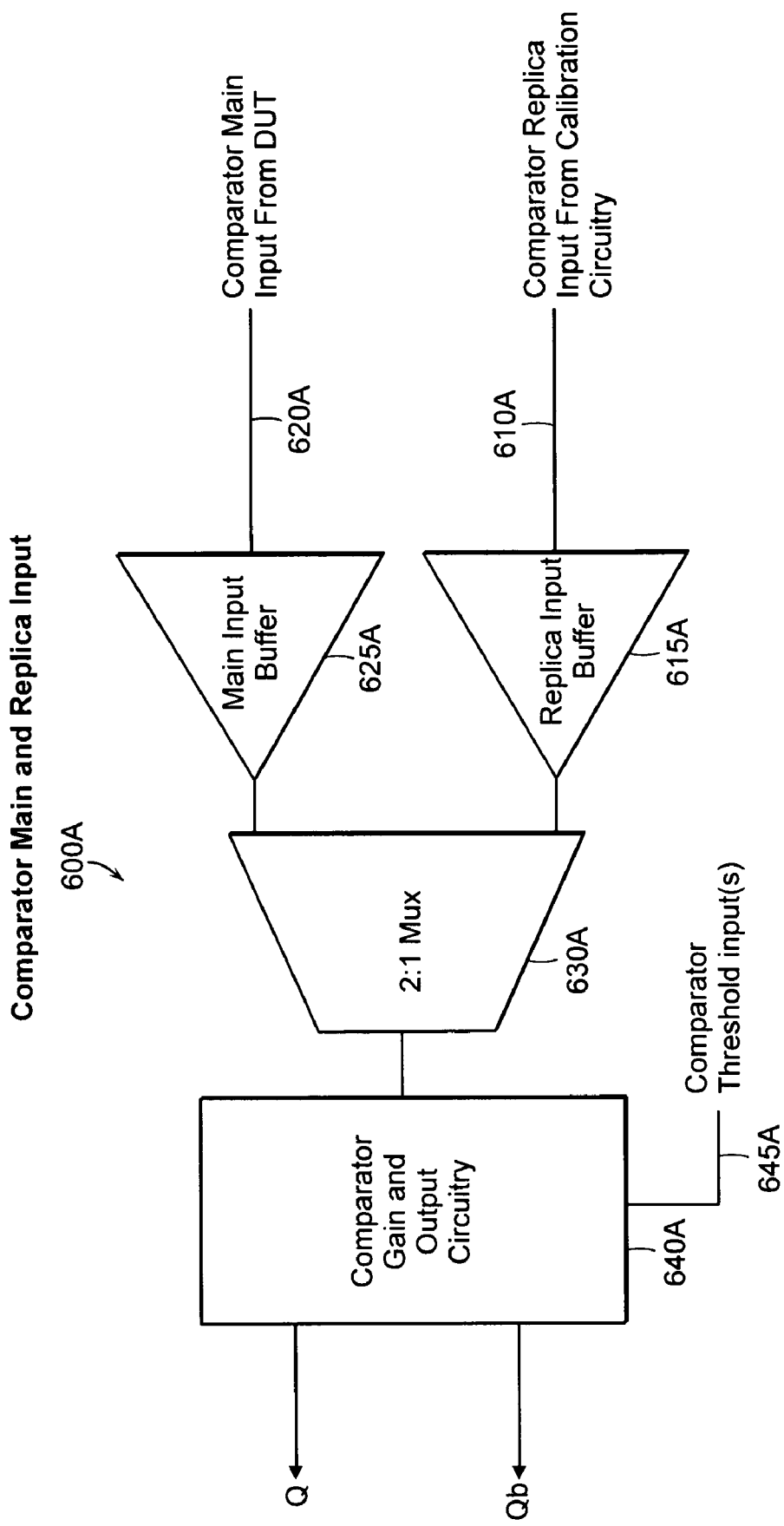
FIG. 6A is a schematic of another embodiment of a comparator for providing replica input.

FIG. 6A shows another embodiment of a comparator 600a for providing a replica input. In this embodiment the comparator includes a replica input. The replica input buffer 615A is a low power scaled version of the main input buffer 625A of the comparator. The two buffers are coupled to a 2:1 multiplexor 630A. The multiplexor 630A feed into a comparator gain and output circuitry 640A. The calibration circuitry would select the replica input and force a set of voltages for calibration. The voltage on the threshold input(s) 645A of the comparator gain and output circuitry 640A would also be provided by the calibration circuitry. As stated previously, a plurality of tests would be conducted to obtain the voltage offset error and gain caused by the input buffer and main comparator circuitry. In this embodiment, a replica output could be incorporated to feed the output to the calibration circuitry.

Figure 7:
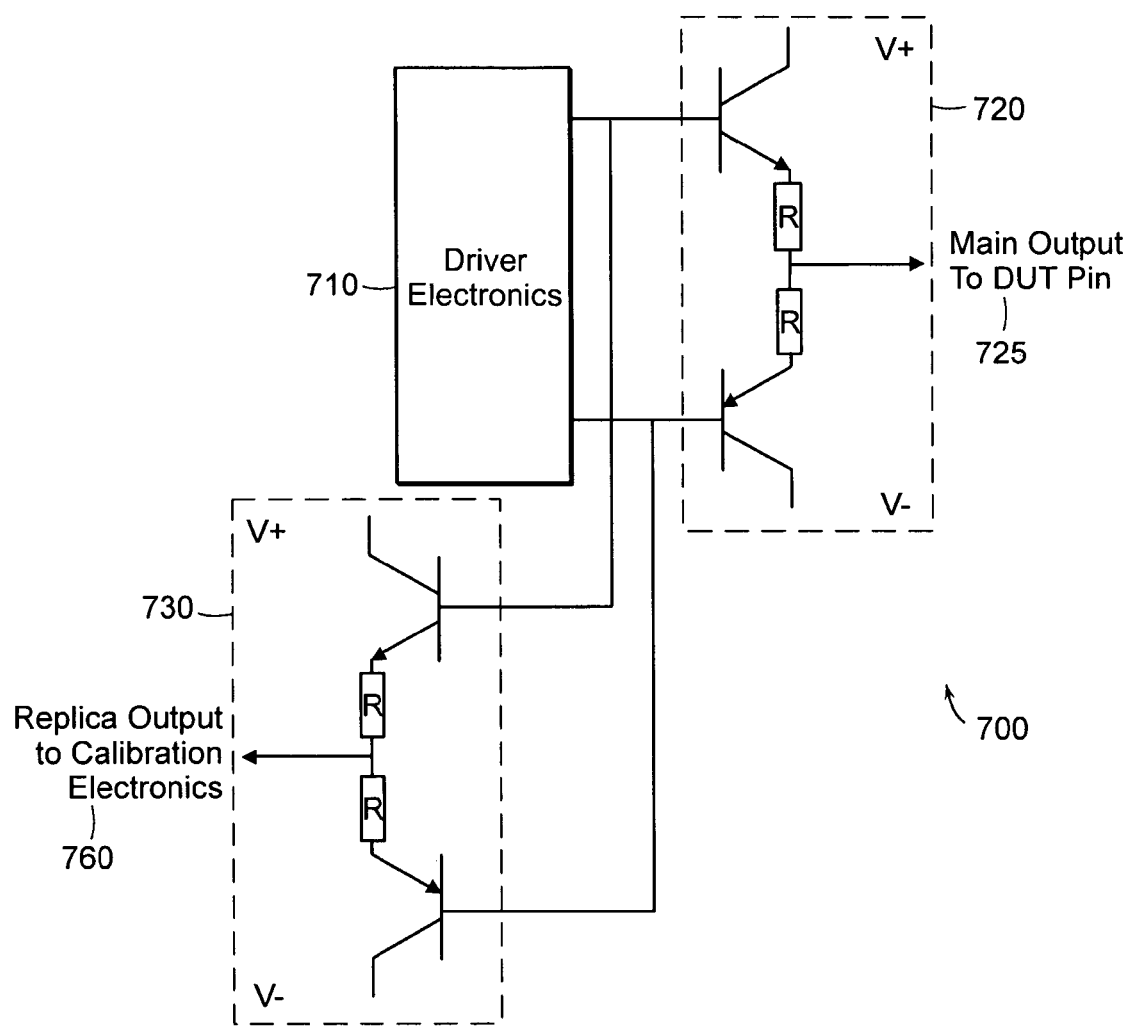
FIG. 7 is a schematic showing how the replica output for a driver is produced.

FIG. 7 is a schematic showing how the replica output 760 for a driver 700 is produced. The circuit includes driver electronics 710 and a class AB driver stage 720 as the output stage. Although a class AB driver output stage is shown, other output stages may be substituted. The driver electronics 710 represent the standard driver functionality and can be implemented in any one of a number of ways as known to those of ordinary skill in the art. The class AB output stage 720 is formed from a pair of bipolar transistors (NPN and PNP) that are coupled together at their emitters by a pair of resistors. The output 725 is defined as the point between the two resistors. The driver electronics 710 feed signals into the base of each of the bipolar transistors. The replica output 760 is created by taking the voltages that are at the bases of the bipolar transistors and feeding them into a duplicative AB output stage 730 having the same structure as the main output stage. Thus, in this embodiment two bipolar transistors are used to define the replica AB output stage 730. As with the replica comparator output stage shown in FIG. 5, the transistor of the replica output stage can be sized smaller than those of the regular output stage, but are scaled so as to have the same DC characteristics as the regular output stage.

In certain embodiments, the replica outputs are not necessary and rather than have a replica output stage, the outputs of each of the pin electronics are coupled to a switch, for example, a CMOS multiplexor that can direct the output signals to the calibration circuitry.

FIG. 8 shows pseudo code for controlling the calibration process. This code may be implemented in the state machine of the calibration circuitry. First, the state machine issues a disable signal to the pin electronics that disable external control of the inputs for the pin electronics sub-circuits (driver, comparator, etc.) If the driver is to be calibrated, the calibration circuitry issues a select signal to the calibration input multiplexor to select the driver replica output signal. The calibration state machine causes the levels generator to set Vhigh to zero volts. The calibration circuitry measures the driver output voltage. The voltage is then stored in a register. The calibration circuitry causes the levels generator to set Vhi to 5V. Although 0 and 5 Volts have been selected as the testing levels, any two convenient voltage levels would also work. The driver output voltage is measured by the calibration circuitry. The driver output voltage is stored in another register. The calibration state machine then calculates a slope error. The slope error is determined by taking the expected gain and comparing it to the gain as calculated based upon the two test levels. Methods for calculating a gain based upon two points are well known to those of ordinary skill in the art. The slope/gain error is stored for Vhigh in a register. The calibration state machine then calculates the voltage offset error by comparing the output voltages to the expected output voltage. The offset error can be determined by solving the linear equation $Y=mX+B$ wherein Y is the output voltage, m is the gain, X is the input voltage, and B is the offset voltage. The offset error is then checked to see if the offset error is within a range for which compensation can be provided. If the offset error is not within the range a fail flag is set. The slope error is then compared to the expected slope error. If the slope error does not fall within a range of slope errors that are correctable, then the fail flag is set. These steps are repeated for each of the driver levels. For example, the steps can be repeated for Vlow and Vterm for the driver.

If the fail flag is not set, error values, the gain error (slope error) and the voltage offset can be used to compensate any further input signals. The compensation can be applied externally by the main control unit. The main control unit can read the registers and can multiply the desired voltage or current by the appropriate gain and subtract the offset. For example, if the gain error is determined to be −1% and the offset is +1 mV, then the main control unit will take the desired voltage, e.g. 5V and multiply this by 1.01 and subtract 1 mV. The digital number representing the compensated voltage will be sent to the levels generator. In other embodiments, the calibration state machine can perform the computation and automatically apply the compensation whenever the desired voltage/current is requested.

When the comparator is calibrated, the calibration state machine causes a select signal to be transmitted to the output multiplexor to select the comparator replica output. Additionally, there is a separate multiplexor, such as that shown in FIG. 5a for selection of the comparator input signal. The calibration state machine causes a select signal to be transmitted to the multiplexor (See FIG. 1) to select the replica input. The calibration state machine sends a control signal to the levels generator to generate an input signal on the replica input. As shown in the pseudo-code, the levels generator forces a zero voltage level on the comparator replica input. The calibration electronics receives the output from the replica output and causes the levels generator to adjust the comparator threshold voltage until the voltage level at the output switches state. The value of the comparator threshold voltage when the comparator switches states is then saved in a register. This value is the amount of offset voltage for the comparator. The calibration circuitry then causes the levels generator to force 5V on the replica input of the comparator. As with the driver, the selection of 0 and 5V is exemplary and other voltage levels could be substituted. The calibration circuitry reads the output voltage from the replica outputs and causes the levels generator to change the level of the threshold voltage for the comparator. This process is iterative until the output voltage level switches. Based upon the threshold voltage levels that caused the comparator to switch states, the gain or slope error can be determined. The offset error that is stored in a register is retrieved by the calibration state machine and compared to the range of values for which compensation can be applied. If the offset error is not within the range a fail flag is set. The gain error is then compared with the specified gain error from the manufacturer. If the gain error is not within an acceptable tolerance for which compensation can be applied then the fail flag is set. This process is repeated for the other comparator levels including the low threshold level for the comparator. If the fail flag has not been set, the stored error values can be retrieved by the calibration state machine or the main control unit to determine a compensation equation that can be applied for the desired level. The process just described for the comparator can be extended so to include calculations for both differential comparator inputs as well as common mode inputs.

The pseudo-code also shows the calibration code for a load. The load calibrated so that the load provides the proper sourcing and sinking currents. A representative load is shown in FIG. 4. Three calibrations are necessary for the load. Vcom, Iol and Ioh. To begin performing these calculations, the calibration state machine first issues a select signal to the replica output multiplexor (the input for the multiplexor 269 is shown in the block diagram of FIG. 1) to receive in the replica output from the load. The calibration state machine then sets the calibration circuitry to a current measure mode of operation. The calibration state machine causes the levels generator to set the commutation voltage for the load, which may be diode bridge circuit, to a known value, for example 2V. The state machine then signals the levels generator to generate a signal to the controllable current source Iol to produce a predetermined current level (e.g. 1 mA). The output current from the replica output is measured by the calibration state machine. This value is saved in a register. The state machine then causes the levels generator to set a different current for Iol (e.g. 10 mA). The load current at the output is measured by the calibration state machine. This measurement is stored in a register. The calibration state machine then calculates the offset and slope errors (gain) based upon the values stored in the registers and the known input values. This is the offset error for Iol. If the offset error is not within a range for which compensation can be applied then the calibration state machine sets a fail flag. The calibration state machine then compares the slope error (gain) to the range of gain errors for which compensation can be applied. If the slope error is not within the range a fail flag is set.

The same procedures can be performed when the commutation voltage is set to a negative voltage in order to determine the offset error and slope error (gain) for Ioh. The state machine causes the levels generator to set Vcom to a negative voltage (e.g. −2V). The state machine then causes the levels generator to set the programmable current source Ioh to a predetermined level (e.g. 1 mA). The output current from the replica outpour is measured by the calibration state machine and is saved in a register. The calibration state machine issues a control signal to the levels generator to set the programmable current source Ioh to a different current level (e.g. 10 mA). The load current at the output is measured by the calibration state machine. The calibration state machine then calculates the current offset and slope errors (gain) based upon the two values stored in the input, as well as the initial commutation voltage. The calibration state machine then compares the offset error and the slope error to sets of values (ranges) for which the errors can be compensated. If the errors can not be compensated, a fail flag is set.

The calibration state machine then switches the measurement mode to voltage from current. The calibration state machine then causes the levels generator to set Ioh and Iol to a predetermined value, such as 1 mA. The calibration state machine then causes the levels generator to set Vcom to a predetermine voltage, such as 0 V. The output voltage is sensed by the calibration circuit and the state machine save the output voltage which is the Vcom offset voltage. The calibration state machine then causes Vcom to be set to another predetermined voltage, such as 5 V. The output voltage of the load is measured using the replica output. This value is stored in a register. The state machine can then calculate a slope error (gain) for the load circuit. The error for the slope is then compared to the specification as is the offset error. If either is outside of the tolerance for the specification, a fail flag is set. Once the test is complete, the state machine sends a pass or fail signal over the bus interface to the main control system.

Again as previously stated, if the fail flag is not set, either the main control unit or the calibration state machine can compensate for the gain and offset. As stated above, a separate DAC within the levels generator circuitry can receive in a voltage offset and a percentage gain offset and can compensate for the errors by producing a compensated analog signal for controlling the pin electronics.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

What is claimed is:

1. An integrated circuit comprising:
a substrate;
pin electronics integral with the substrate having a plurality of outputs;
the pin electronics including:
a first signal buffer electrically coupled to a first of the plurality of outputs of the pin electronics, the first signal buffer producing an output signal and capable of being electrically coupled to a device under test;
a second signal buffer electrically coupled to a second of the plurality of outputs of the pin electronics, the second signal buffer producing a calibration signal that is a scaled copy of the output signal; and
a calibration circuit having at least one input electrically coupled to the second of the plurality of outputs of the pin electronics and integral with the substrate.

2. The integrated circuit according to claim 1, wherein the calibration circuit can operate while a device under test is electrically coupled to the first signal buffer.

3. The integrated circuit according to claim 1, wherein the pin electronics includes at least a third signal buffer coupled to a third of the plurality of outputs, the third output electrically coupled to the input of the calibration circuit and the at least one input of the calibration circuit further includes a multiplexor for selectively outputting one of a plurality of scaled signals from either the second signal buffer or the third signal buffer.

4. The integrated circuit according to claim 1, wherein the pin electronics include at least one input and one calibration input; and the calibration circuit disables the at least one input and produces a signal to a calibration input of the pin electronics for calibrating at least a portion of the pin electronics.

5. The integrated circuit according to claim 1, wherein the pin electronics includes a comparator electrically coupled to the second signal buffer.

6. The integrated circuit according to claim 1, wherein the pin electronics includes an active load.

7. The integrated circuit according to claim 1, wherein the pin electronics includes a driver electrically coupled to the second signal buffer.

8. The integrated circuit according to claim 1, wherein the pin electronics includes a parametric measurement unit.

9. The integrated circuit according to claim 1, wherein the calibration circuit includes a state machine.

10. The integrated circuit according to claim 1, further comprising:
a levels generator that is integral with the substrate.

11. The integrated circuit according to claim 10 wherein the calibration circuit is electrically coupled to the levels generator and the levels generator is electrically coupled to the pin electronics; and
wherein the calibration circuit controls the levels generator during calibration.

12. A method for calibrating pin electronics for a channel of automatic testing equipment, the method comprising:
coupling a device under test to a first output of pin electronics for a channel of the automatic testing equipment, the first output being part of a signal buffer;
inhibiting an input pin for the pin electronics of the channel;
providing a test signal to a calibration input of the pin electronics for the channel originating from a calibration circuit dedicated to the channel;
receiving a calibration output signal from a second signal buffer through a calibration output of the pin electronics into the calibration circuit; and
determining one or more calibration parameters in the calibration circuit based upon the output signal.

13. The method according to claim 12, further comprises:
selectively passing through a multiplexor of the calibration circuit a calibration output signal from one of a plurality of calibration outputs of the pin electronics.

14. The method according to claim 12, further comprising:
a state machine of the calibration circuit, providing a control signal to the multiplexor to select the output.

15. The method according to claim 12, wherein the calibration output signal is from a comparator, and wherein the one or more calibration parameters include voltage offset.

16. The method for calibrating pin electronics for a channel of automatic testing equipment according to claim 12, wherein the calibration output signal is from a driver, and wherein the one or more calibration parameters includes voltage offset.

* * * * *